(12) United States Patent
Terrill

(10) Patent No.: US 9,064,896 B2
(45) Date of Patent: Jun. 23, 2015

(54) TRANSISTOR STRUCTURE WITH FEED-THROUGH SOURCE-TO-SUBSTRATE CONTACT

(71) Applicant: Vishay-Siliconix, Santa Clara, CA (US)

(72) Inventor: Kyle Terrill, Santa Clara, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 14/102,208

(22) Filed: Dec. 10, 2013

(65) Prior Publication Data

US 2014/0099765 A1    Apr. 10, 2014

Related U.S. Application Data

(62) Division of application No. 12/917,172, filed on Nov. 1, 2010, now Pat. No. 8,604,525.

(60) Provisional application No. 61/257,362, filed on Nov. 2, 2009.

(51) Int. Cl.
| H01L 21/28 | (2006.01) |
|---|---|
| H01L 29/66 | (2006.01) |
| H01L 21/74 | (2006.01) |
| H01L 29/417 | (2006.01) |
| H01L 29/78 | (2006.01) |
| H01L 29/40 | (2006.01) |
| H01L 29/45 | (2006.01) |
| H01L 29/49 | (2006.01) |

(52) U.S. Cl.
CPC ........ *H01L 29/66696* (2013.01); *H01L 21/743* (2013.01); *H01L 29/402* (2013.01); *H01L 29/4175* (2013.01); *H01L 29/456* (2013.01); *H01L 29/4933* (2013.01); *H01L 29/66659* (2013.01); *H01L 29/7835* (2013.01); *H01L 21/28008* (2013.01); *H01L 29/4916* (2013.01)

(58) Field of Classification Search
USPC ........... 257/271, 288, 327, 341; 438/218, 570
See application file for complete search history.

(56) References Cited

U.S. PATENT DOCUMENTS

| 4,663,644 A | 5/1987 | Shimizu |
|---|---|---|
| 5,326,711 A | 7/1994 | Malhi |
| 5,473,176 A | 12/1995 | Kakumoto |
| 5,648,283 A | 7/1997 | Tsang et al. |
| 5,742,076 A | 4/1998 | Sridevan et al. |
| 5,760,440 A | 6/1998 | Kitamura et al. |
| 5,770,514 A | 6/1998 | Matsuda et al. |
| 5,866,931 A | 2/1999 | Bulucea et al. |
| 5,929,481 A | 7/1999 | Hshieh et al. |
| 5,998,833 A | 12/1999 | Baliga |

(Continued)

FOREIGN PATENT DOCUMENTS

| DE | 10239310 A1 | 3/2004 |
|---|---|---|
| EP | 1170803 A2 | 1/2002 |

(Continued)

*Primary Examiner* — Calvin Lee

(57) ABSTRACT

An LDMOS (laterally diffused metal oxide semiconductor) structure connects the source to a substrate and also the gate shield while utilizing a reduced area for such contacts. The structure includes an electrically conductive substrate layer, a source, and a drain contact; the drain contact is separated from the substrate layer by at least one intervening layer. An electrically conductive trench-like feed-through element passes through the intervening layer and contacts the substrate and the source to electrically connect the drain contact and the substrate layer.

17 Claims, 7 Drawing Sheets

(56) References Cited

U.S. PATENT DOCUMENTS

| | | | |
|---|---|---|---|
| 6,049,108 A | 4/2000 | Williams et al. | |
| 6,057,558 A | 5/2000 | Yamamoto et al. | |
| 6,133,587 A | 10/2000 | Takeuchi et al. | |
| 6,211,018 B1 | 4/2001 | Nam et al. | |
| 6,246,090 B1 | 6/2001 | Brush et al. | |
| 6,319,777 B1 | 11/2001 | Hueting et al. | |
| 6,346,438 B1 | 2/2002 | Yagishita et al. | |
| 6,413,822 B2 | 7/2002 | Williams et al. | |
| 6,511,885 B2 | 1/2003 | Harada et al. | |
| 6,552,389 B2 * | 4/2003 | Yasuhara et al. | 257/335 |
| 6,627,950 B1 | 9/2003 | Bulucea et al. | |
| 6,649,975 B2 | 11/2003 | Baliga | |
| 6,737,704 B1 | 5/2004 | Takemori et al. | |
| 6,764,889 B2 | 7/2004 | Baliga | |
| 6,797,588 B2 | 9/2004 | Ishikawa et al. | |
| 6,838,730 B1 | 1/2005 | Kawaguchi et al. | |
| 6,891,223 B2 | 5/2005 | Krumrey et al. | |
| 6,906,380 B1 | 6/2005 | Pattanayak et al. | |
| 6,919,248 B2 | 7/2005 | Francis et al. | |
| 6,974,750 B2 | 12/2005 | Haase | |
| 7,061,057 B2 | 6/2006 | Babcock et al. | |
| 7,138,690 B2 * | 11/2006 | Xie et al. | 257/401 |
| 7,235,845 B2 | 6/2007 | Xu et al. | |
| 7,279,743 B2 | 10/2007 | Pattanayak et al. | |
| 7,282,765 B2 | 10/2007 | Xu et al. | |
| 7,344,945 B1 | 3/2008 | Pattanayak et al. | |
| 7,361,558 B2 | 4/2008 | Pattanayak et al. | |
| 7,576,388 B1 | 8/2009 | Wilson et al. | |
| 7,833,863 B1 | 11/2010 | Pattanayak et al. | |
| 7,952,145 B2 | 5/2011 | Korec et al. | |
| 8,368,126 B2 | 2/2013 | Pattanayak et al. | |
| 8,604,525 B2 * | 12/2013 | Terrill | 257/271 |
| 2001/0003367 A1 | 6/2001 | Hshieh et al. | |
| 2001/0023959 A1 | 9/2001 | Harada et al. | |
| 2002/0019099 A1 | 2/2002 | Williams et al. | |
| 2002/0125528 A1 | 9/2002 | Kawaguchi et al. | |
| 2002/0179945 A1 | 12/2002 | Sakamoto et al. | |
| 2003/0001203 A1 | 1/2003 | Ono et al. | |
| 2003/0006456 A1 | 1/2003 | Takahashi et al. | |
| 2003/0008460 A1 | 1/2003 | Darwish | |
| 2003/0062570 A1 | 4/2003 | Darwish et al. | |
| 2003/0062622 A1 | 4/2003 | Pavier et al. | |
| 2003/0178673 A1 | 9/2003 | Bhalla et al. | |
| 2004/0108554 A1 | 6/2004 | Hshieh et al. | |
| 2004/0195618 A1 | 10/2004 | Saito et al. | |
| 2005/0017298 A1 | 1/2005 | Xie et al. | |
| 2005/0093097 A1 | 5/2005 | Baiocchi et al. | |
| 2005/0280085 A1 | 12/2005 | Babcock et al. | |
| 2005/0287744 A1 | 12/2005 | Ono et al. | |
| 2006/0060895 A1 | 3/2006 | Hikita et al. | |
| 2006/0220124 A1 | 10/2006 | Ohtake | |
| 2006/0273383 A1 | 12/2006 | Hshieh | |
| 2007/0013008 A1 | 1/2007 | Xu et al. | |
| 2007/0034944 A1 | 2/2007 | Xu et al. | |
| 2008/0135872 A1 | 6/2008 | Chen et al. | |
| 2008/0142883 A1 | 6/2008 | Grebs et al. | |
| 2008/0197411 A1 | 8/2008 | Korec et al. | |

FOREIGN PATENT DOCUMENTS

| | | |
|---|---|---|
| JP | 2007142272 A | 6/2007 |
| JP | 2007287813 A | 11/2007 |

* cited by examiner

TRANSISTOR STRUCTURE WITH FEED-THROUGH SOURCE-TO-SUBSTRATE CONTACT

RELATED U.S. APPLICATION

This application is a continuation (divisional) application of the U.S. patent application with Ser. No. 12/917,172 by K. Terrill, filed on Nov. 1, 2010 now U.S. Pat. No. 8,604,525 issued Dec. 10, 2013, entitled "Transistor Structure with Feed-Through Source-to-Substrate Contact," now U.S. Pat. No. 8,604,525, which claims priority to the U.S. Provisional Patent Application with Ser. No. 61/257,362 by K. Terrill, filed on Nov. 2, 2009, entitled "Transistor Structure with Feed-Through Source-to-Substrate Contact," both of which are hereby incorporated by reference in their entirety.

FIELD OF THE INVENTION

Embodiments in accordance with the present invention generally pertain to semiconductor devices.

BACKGROUND

In DC-DC power supplies, optimization of the control MOSFET (metal oxide semiconductor field effect transistor) requires minimization of both conduction and switching losses. Historically, planar or trench DMOS (diffused MOS) devices have been used for switching due to their lower resistance and thus low conduction loss. Those MOSFET structures have utilized drain contact through the substrate of the wafer. Although those structures provide low resistance, they are not satisfactory with regard to low switching loss. LDMOS (laterally diffused MOS) devices have historically been used in RF (radio frequency) applications that require very low switching loss at high frequency. If LDMOS devices can achieve resistance comparable to that of planar or trench DMOS devices, they will have higher conversion efficiency due to their reduced switching loss.

Techniques for reducing the LDMOS cell pitch are needed to obtain lower resistance. In the co-packaging of both control and synchronous MOSFETs in a single package, it is desirable to have the control MOSFET with a drain contact at the top of the die and the source contact at the bottom of the die. To reduce the package footprint, the control MOSFET can be stacked on top of the synchronous MOSFET.

In a conventional RF LDMOS power transistor, in order to have the drain contact of the LDMOS at the top of the die, the source contact must be at the bottom of the die. This requires a contact between the n+ surface source region and the p+ substrate. It is important that this contact consume a small area because this will reduce the cell pitch and thus reduce the total resistance of the MOSFET for a given area. It is also important that the contact have very low resistance so that it does not significantly contribute to the resistance of the MOSFET. In addition, a gate shield connected to the source electrode should be included to reduce the electric field between the gate and drain regions of the device. The gate shield resistance should be low for good high frequency performance; this can be achieved if the gate shield is connected locally to the source. In a discrete power MOSFET, the gate shield cannot be made from metal because there can be only one layer of metal in the process and that layer of metal is used for the drain connection and gate routing. Thus, the gate shield is made of a conductor lying below the metal. The conductor used for such a shield is heavily doped polysilicon due to its ease of formation and its stability.

Previous attempts at forming a source-to-substrate connection have used a budding contact from the n+ source to a p+ sinker. This technique consumes too much area and, because it does not use metallization to contact the substrate, has high resistance. Another technique etches a trench down to the substrate and connects the source to the substrate using silicide and aluminum metal. This technique also consumes too much area because the trench must have a very sloped profile to avoid aluminum voiding. In forming a contact, a trench can be etched and metallization used to connect the n+ source to the p+ substrate because this reduces the resistance. However, the metallization must be able to reach the p+ substrate through a narrow opening.

SUMMARY

Embodiments according to the present invention provide solutions to the problems described above. In one embodiment, an LDMOS structure connects the source to a substrate and also the gate shield while utilizing a reduced area for such contacts. In one embodiment, the gate shield is constructed using heavily doped polysilicon and is isolated from the drain metallization. The process requires only a single metal layer. In one embodiment, tungsten feed-throughs that contact the gate shield, n+ source, and p+ substrate are used. The feed-throughs have relatively reduced widths due to improved process capability for filling a high aspect ratio, deep trench with chemical vapor deposition (CVD) titanium (Ti), Ti-nitride (TiN), and tungsten (W) plug processing.

These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification.

DETAILED DESCRIPTION

Figure 1:
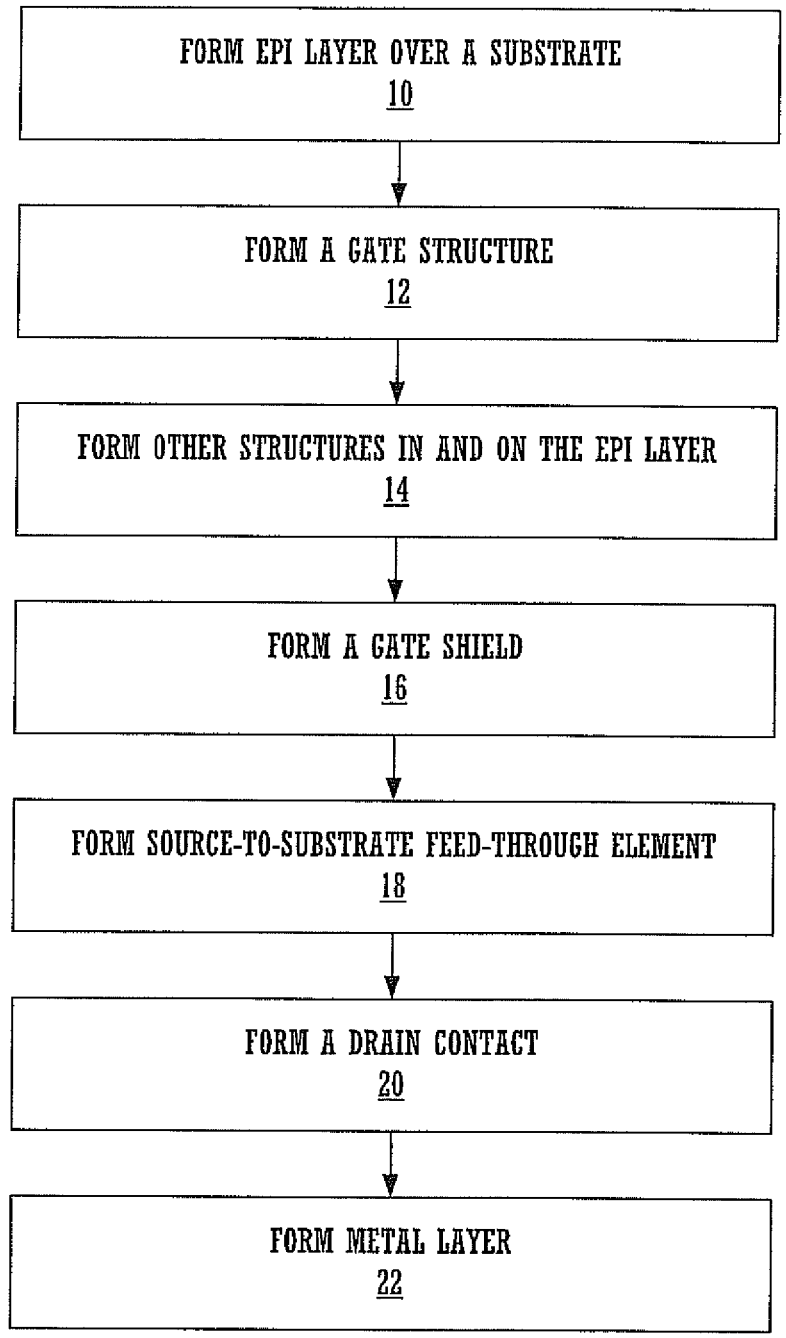
FIG. 1 is a flowchart of an example of a method for fabricating a semiconductor device according to an embodiment of the present invention.

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching" or the like, refer to actions and processes of semiconductor device fabrication.

As used herein, the letter "n" refers to an n-type dopant and the letter "p" refers to a p-type dopant. A plus sign "+" or a minus sign "−" is used to represent, respectively, a relatively high or relatively low concentration of the dopant.

The term "channel" is used herein in the accepted manner. That is, current moves within a field effect transistor (FET) in a channel, from the source connection to the drain connection. A channel can be made of either n-type or p-type semiconductor material; accordingly, a FET is specified as either an n-channel or a p-channel device.

Although described in the context of an n-channel device, embodiments according to the present invention are not so limited. That is, the features described herein can be utilized in a p-channel device. The description can be readily mapped to a p-channel device by substituting n-type dopant and materials for corresponding p-type dopant and materials, and vice versa.

First described is a process for fabricating a device according to embodiments of the invention. Although specific steps are disclosed, such steps are only examples. That is, embodiments according to the present invention are well suited to performing various other steps or variations of the recited steps. Figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the present invention can be implemented in conjunction with these other (perhaps conventional) structures, processes and steps without significantly perturbing them. Generally speaking, embodiments in accordance with the present invention can replace portions of a conventional device or process without significantly affecting peripheral structures, processes and steps.

Figure 2:
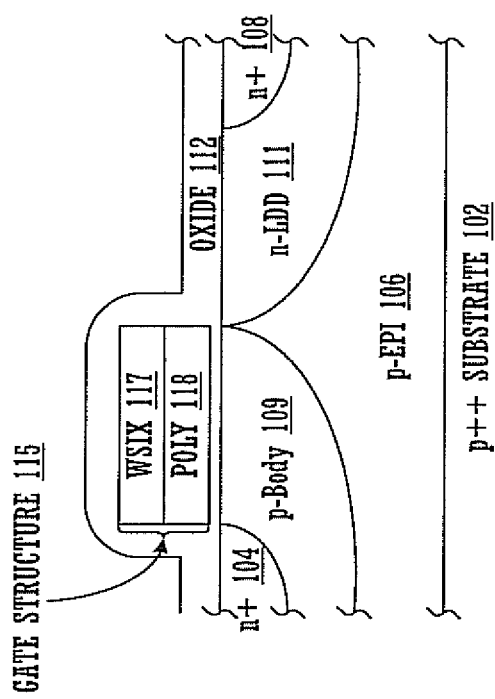
FIGS. 2, 3, 4, 5, and 6 are cross-sectional views showing elements of a semiconductor device at various fabrication stages according to an embodiment of the present invention.

With reference to block 10 of FIG. 1, and also with reference to FIG. 2, a p-type epitaxial (epi) layer 106 is grown over a heavily doped (e.g., p++) substrate 102. Additional p-type implants (not shown) can then be carried out to selectively enhance the epi concentration. A sacrificial oxide layer (not shown) can be grown and stripped, and then a gate oxide layer (which will form a part of layer 112) can be grown. Doped polysilicon and WSix (tungsten silicide) can then be deposited over the gate oxide as a prelude to forming a gate structure 115.

In block 12 of FIG. 1, and continuing with reference to FIG. 2, a gate structure 115 is formed. More specifically, in one embodiment, a photolithographic process can be used to selectively deposit photoresist (not shown) over the area where the gate structure 115 is to be formed. A plasma etch step can be used to remove the WSix and doped polysilicon outside that area, thereby forming gate structure 115 that includes both a WSix layer 117 and a polysilicon layer 118.

In block 14 of FIG. 1, with reference also to FIG. 2, other structures are formed on and within the epi layer 106. More specifically, in one embodiment, another photolithographic process can be used to selectively deposit photoresist (not shown) in all areas outside a region where a p-type body region 109 is to be formed. A combination of vertical and angled implants can then be used to form the body region 109.

After cleaning the wafer, an implant anneal or body drive can be performed. An oxide layer (part of layer 112) is created on the sides of the gate structure 115 using either thermal oxidation or oxide spacer formation techniques.

A photolithographic process can be used to selectively deposit photoresist (not shown) in areas outside a region where an n-LDD (lightly doped drain) region 111 is to be formed. Then, implants can be used to form the extended drain LDD region 111.

A photolithographic process can be used to selectively deposit photoresist (not shown) in all areas outside a region when n+ source region 104 and n+ drain region 108 are to be formed, and an arsenic implant can then be used to form the source region 104 and drain region 108. After cleaning the wafer, a source implant anneal can be performed.

Plasma or TEOS (tetraethyl orthosilicate) oxide can then be deposited and annealed to complete the gate shield oxide layer 112.

Figure 3:
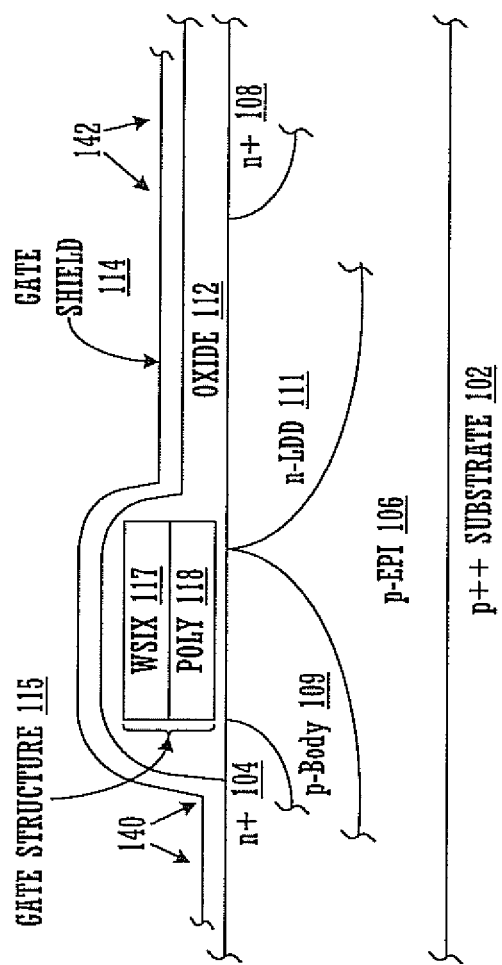

In block 16 of FIG. 1, with reference also to FIG. 3, a gate shield 114 is formed. More specifically, in one embodiment, a photolithographic process can be used to selectively deposit photoresist (not shown) in areas except for the gate shield to n+ source contact region 140. The gate shield oxide layer 112 can then be etched away in the region 140, exposing the underlying source region 104. After cleaning the wafer and using a dilute HF (hydrofluoric acid) last pretreatment, a gate shield 114 can be deposited over the remainder of the oxide layer 112 and over the source region 104. Significantly, the gate shield 114 is in contact with the underlying source region 104. In one embodiment, the gate shield 114 is formed using doped polysilicon.

Figure 4:
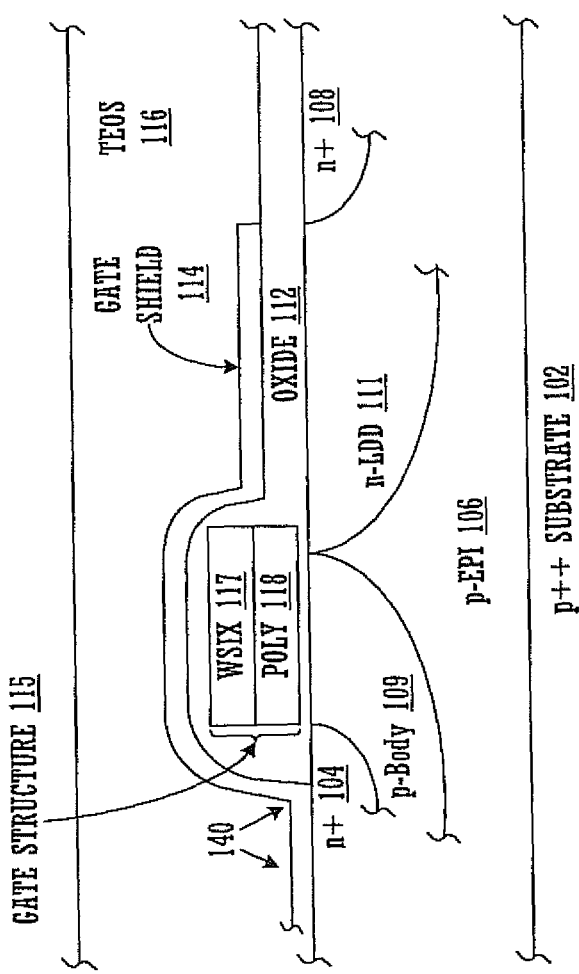

With reference to FIG. 3, a photolithographic process can be used to selectively deposit photoresist (not shown) over the gate shield 114 except for a region 142. A plasma etch step can then be used to remove the gate shield material in the region 142, outside the area covered by the photoresist as shown in FIG. 4. After cleaning the wafer, a relatively thick TEOS layer 116 can be deposited and then etched back to form a planar surface without exposing the gate shield 114 as shown in FIG. 4.

Figure 5:
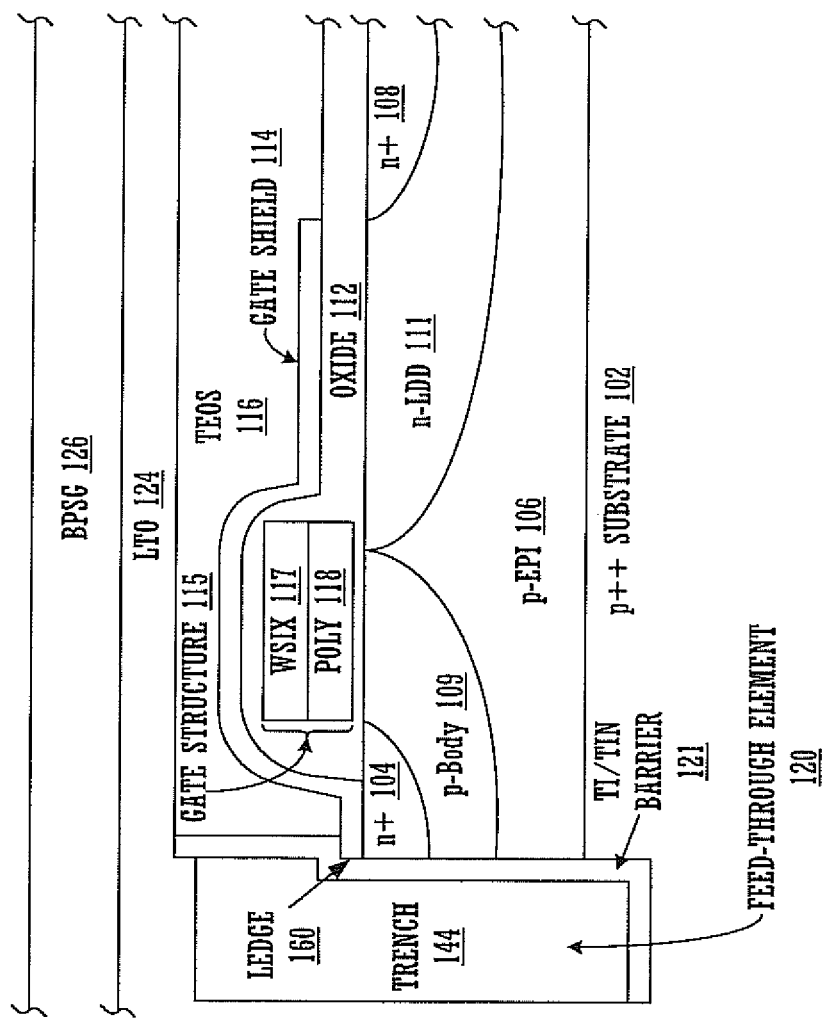

In block 18 of FIG. 1, and with reference to FIG. 5, a source-to-substrate feed-through element 120 is formed. More specifically, in one embodiment, a photolithographic process can be used to selectively deposit photoresist (not shown) in areas outside the area where the source-to-substrate feed-through contact is to be formed. A two-step plasma etch can be used to etch a trench 144 for the feed-through contact. First, a plasma oxide etch can be used to etch the TEOS layer 116 on top of the epi layer 106. Then, a plasma silicon etch can be used to form the trench 144 through the epi layer 106 and extending into the p+ substrate 102. After cleaning the wafer and using a dilute HF last pretreatment, the upper portion of the trench 144 is wider than the lower portion, forming a ledge at the point 160 where the gate shield 114 meets the feed-through element 120. A conformal coating of titanium (Ti) layer and titanium-nitride (TiN) layer can be deposited to line the sides and bottom of the trench 144, followed by a rapid thermal anneal to form a titanium-silicide contact.

A CVD tungsten (W) layer can then be deposited into the trench 144 to form the feed-through element 120. The tungsten layer is thick enough to completely fill the trench. The tungsten can then be etched to remove the Ti and TiN layers that are exposed without etching the tungsten. The ledge 160 improves the contact between the metal and the adjacent silicon, and reduces the contact resistance.

Low temperature oxide (LTO) layer 124 and borophosphosilicate glass (BPSG) layer 126 can be deposited over the upper surfaces of the feed-through element 120 and TEOS layer 116 and annealed to stabilize those materials.

Figure 6:
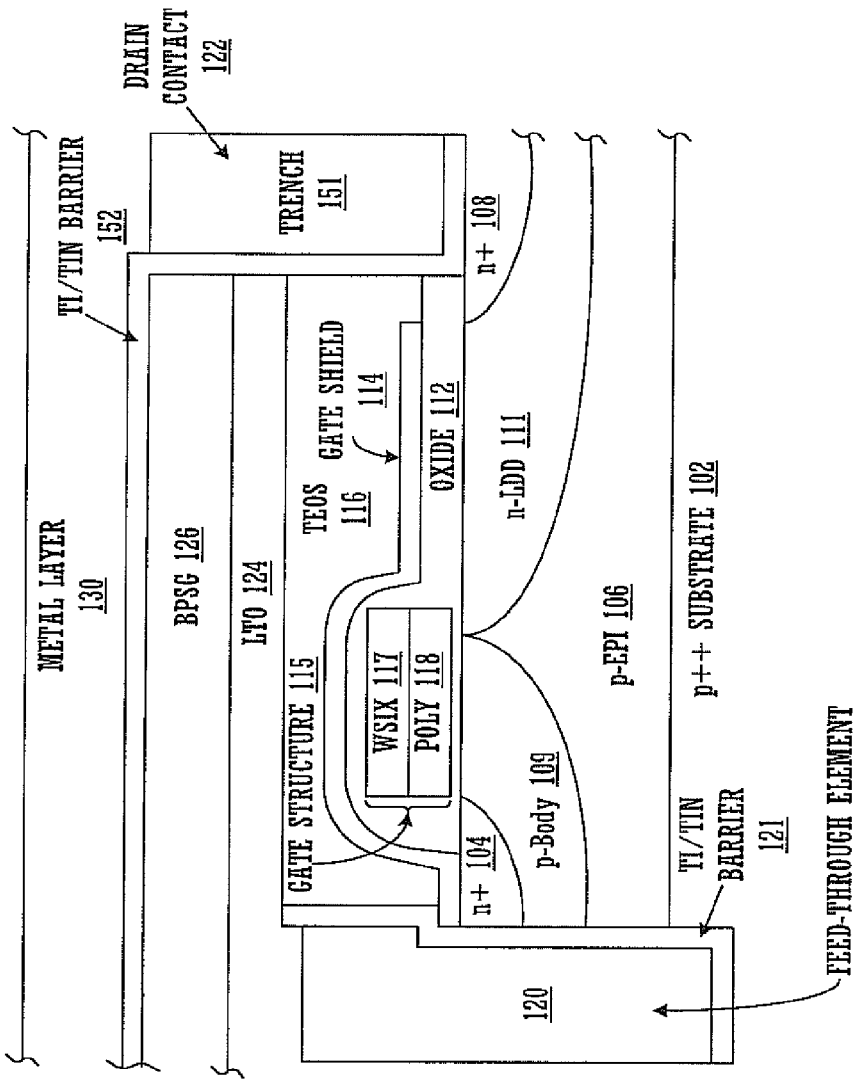

In block 20 of FIG. 1, with reference also to FIG. 6, a drain contact 122 is formed. More specifically, in one embodiment, a photolithographic process can be used to selectively deposit photoresist (not shown) in areas outside the drain contact region. A plasma oxide etch can be used to etch away the oxide (TEOS layer 116) and form the trench 151. After cleaning the wafer and using a dilute HF last pretreatment, a barrier layer 152 that lines the trench 151 and extends over the surface of the BPSG 126 is formed by depositing a Ti layer and a TiN layer. A rapid thermal anneal can be used to form a titanium-silicide contact. A CVD tungsten layer can be deposited to a thickness sufficient for completely filling the trench 151 and form the drain contact 122. The tungsten can then be etched back to planarize the tungsten so that it remains only inside the drain contact 122. Gate contacts (not shown) can be formed in a similar manner.

In block 22 of FIG. 1, a metal layer 130 is formed. More specifically, in one embodiment, a titanium layer (not shown) and a thick aluminum layer can be deposited. A photolithographic process can be used to selectively deposit photoresist (not shown) over the metallization area, and a plasma etch can be used to remove the aluminum and titanium layers outside that area.

Figure 7:
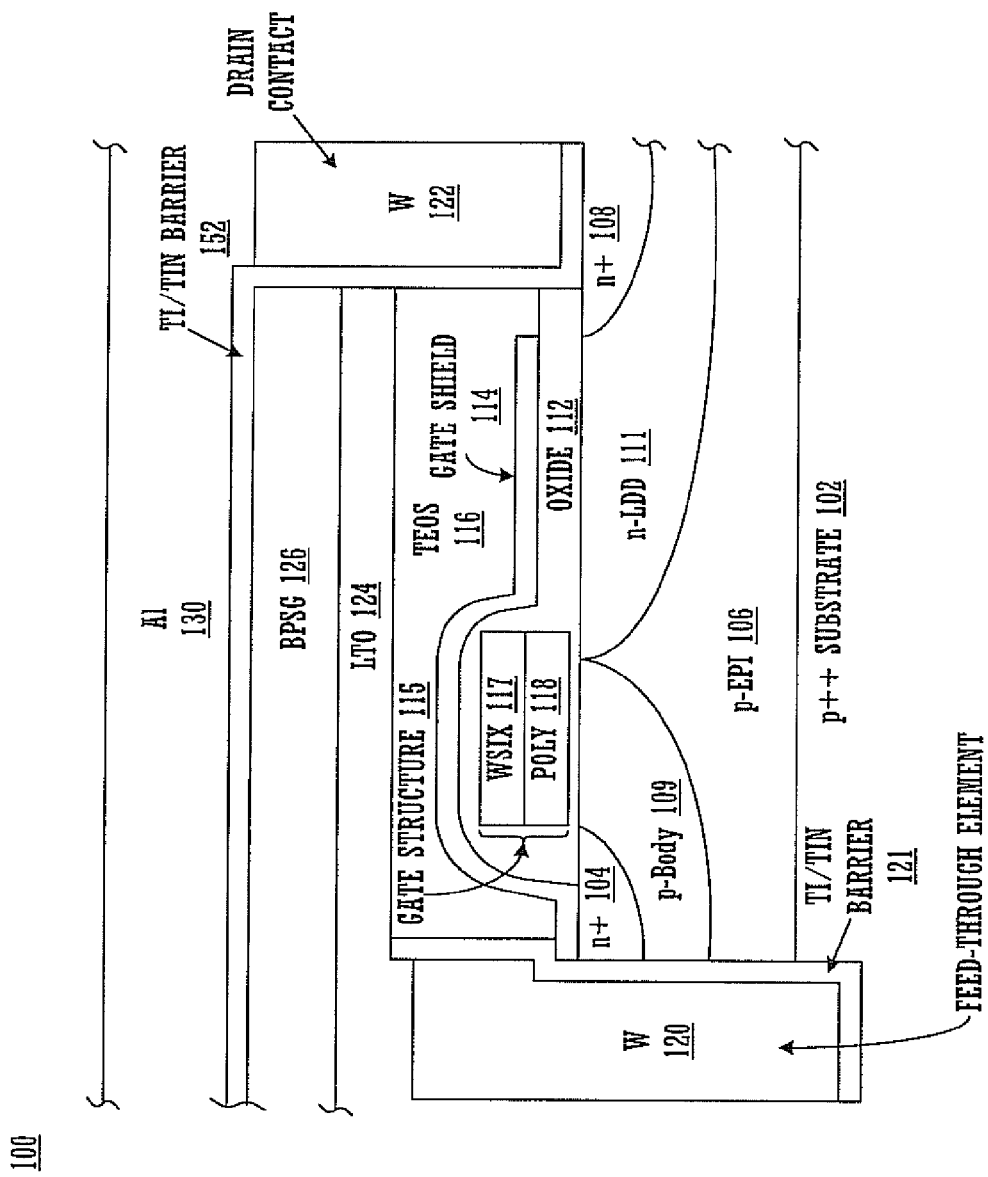
FIG. 7 is a cross-sectional view showing elements of a semiconductor device according to an embodiment of the present invention.

As a result of the process just described, a LDMOS structure such as that illustrated in FIG. 7 is formed. FIG. 7 is a cross-sectional view showing a portion of a semiconductor device 100 according to an embodiment of the present invention. The device 100 can be configured as a flip-chip.

The device 100 includes a conductive (e.g., p++) substrate layer 102. In a flip-chip embodiment, there may be a back metal layer (not shown) adjacent to the substrate layer 102. Considering the orientation of FIG. 7, the back metal layer would be underneath the substrate layer 102. The device also includes epi layer 106. The epi layer includes n+ source region 104, n+ drain region 108, p+ body region 109, and n-LDD region 111. The epi layer 106 may include additional structures, layers or regions not shown in FIG. 7. The substrate layer 102 and the epi layer 106 are thereby isolated from the drain contact 122 by a reverse-biased junction and a MOSFET channel.

An oxide layer 112 isolates the gate shield 114 from the underlying regions including the gate 115, which includes a first (e.g., WSix) layer 117 and a second (e.g., polysilicon) layer 118. The gate shield 114 is also isolated from the drain contact 122. However, the gate shield is in contact with the source region 104. The gate shield 114 is also in contact with the feed-through element 120. The feed-through element 120 is also in contact with the source region 104 and the substrate 102.

A barrier layer 121 (e.g., Ti/TiN) lines the interior of the feed-through element 120. The feed-through element 120 is separated from the aluminum layer 130 by a first (e.g., LTO) layer 124 and a second (e.g., BPSG) layer 126.

In comparison to a conventional device, both the area and the volume consumed by the feed-through element 120 are substantially reduced. Thus, the size of each cell can be reduced, thereby increasing cell density and/or reducing device size, an important consideration when the device 100 is used in mobile/hand-held devices such as cell phones and smart phones. Furthermore, the feed-through element 120 can be fabricated more quickly than a conventional sinker, decreasing manufacturing time and increasing throughput, thereby decreasing costs.

In one embodiment, the feed-through element 120 is made of tungsten because tungsten's thermal coefficient is a better match with silicon than that of doped silicon, and because it has intrinsically lower resistance than doped silicon.

The device 100 can be operated by applying an electrical potential to the gate structure 115 to complete a circuit that includes the source contacts (not shown), the source metal and the drain metal, the structures in the epi layer 106, the substrate layer 102, the drain contact 122, and the feed-through element 120.

In summary, embodiments according to the present invention provide an LDMOS structure that connects the source to a substrate and also to the gate shield while utilizing a reduced area for such contacts. The gate shield can be constructed using heavily doped polysilicon and can be isolated from the drain metallization. Feed-through elements (e.g., tungsten feed-through elements) contact the gate shield, n+ source, and p++ substrate. The feed-through elements have relatively small widths. As a result, the size of cells and hence the size of the device can be reduced, and cell density can be increased.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a semiconductor device, said method comprising:

forming a source region and a drain region in an epitaxial layer grown over a substrate layer;

forming a gate shield that extends over said source region and drain region;

forming a trench-like feed-through element that is filled with metal and passes through said epitaxial layer and that is in contact with said substrate layer and said source region, wherein an upper portion of said feed-through element is wider than a lower portion of said feed-through element, forming a ledge where said upper portion and said lower portion meet, wherein said gate shield contacts said feed-through element at said ledge;

forming a drain contact over said drain region; and forming a first oxide layer over the surface of said metal in said feed-through element and a doped glass layer over said first oxide layer.

2. The method of claim 1 further comprising forming a barrier layer over said doped glass layer, wherein said barrier layer also extends into and lines a trench containing said drain contact and separates said drain contact from said first oxide layer and said doped glass layer.

3. The method of claim 1 wherein said gate shield is formed over said source region, wherein a portion of said gate shield that is over said source region is in contact with said source region.

4. The method of claim 1 wherein said gate shield comprises polysilicon.

5. The method of claim 1 wherein said metal comprises tungsten.

6. The method of claim 1, prior to forming said first oxide layer and said doped glass layer further comprising:
   depositing a second oxide layer over said gate shield and said source region;
   performing a first etch through said second oxide layer and to said epitaxial layer to form a trench corresponding to said upper portion of said feed-through element; and
   performing a second etch to extend said trench through said epitaxial layer and into said substrate layer to form said lower portion of said feed-through element.

7. The method of claim 6 further comprising, after said second etch, coating said trench with a barrier layer and filling said trench with said metal.

8. The method of claim 7 wherein said barrier layer comprises titanium nitride.

9. A method of fabricating a semiconductor device, said method comprising:
   forming a source region and a drain region, both of a second conductivity type, in an epitaxial layer grown over a heavily doped substrate layer, both of a first conductivity type;
   forming a drain contact, wherein said epitaxial and substrate layers are isolated from said drain contact by a reversed-bias junction and a MOSFET (metal oxide semiconductor field effect transistor) channel;
   forming an electrically conductive trench-like feed-through element that is filled with metal and passes through said epitaxial layer and in contact with said substrate layer and said source region;
   forming a gate shield in contact with said feed-through element and over said source region, wherein an upper portion of said feed-through element is wider than a lower portion of said feed-through element;
   forming a ledge, where said upper portion and said lower portion meet, and said gate shield contacts said feed-through element at said ledge; and
   forming an oxide layer over the surface of said metal in said feed-through element and a doped glass layer over said oxide layer.

10. The method of claim 1 wherein said device is selected from the group consisting of: a flip chip; and a laterally diffused metal oxide semiconductor (LDMOS) device.

11. The method of claim 9 wherein said metal comprises tungsten.

12. The method of claim 9 further comprising forming a barrier layer over said doped glass layer.

13. The method of claim 12 wherein said barrier layer also extends into and lines a trench containing said drain contact and separates said drain contact from said oxide layer and said doped glass layer.

14. The method of claim 9 wherein said forming said feed-through element comprises:
   forming a trench in said epitaxial layer and extending into said substrate layer;
   coating said trench with a barrier layer; and
   filling said trench with said metal.

15. The method of claim 14 wherein said barrier layer comprises titanium nitride.

16. The method of claim 9 wherein said gate shield comprises a portion that is above and extends over said source region, wherein said portion that is above and over said source region is in contact with said source region.

17. The method of claim 1 wherein said gate shield comprises polysilicon.

* * * * *